United States Patent [19]

Engle et al.

[11] Patent Number: 5,243,133
[45] Date of Patent: Sep. 7, 1993

[54] CERAMIC CHIP CARRIER WITH LEAD FRAME OR EDGE CLIP

[75] Inventors: Stephen R. Engle, Binghamton; Scott P. Moore, Kirkwood; Mukund K. Saraiya, Endwell, all of N.Y.

[73] Assignee: International Business Machines, Inc., Armonk, N.Y.

[21] Appl. No.: 838,613

[22] Filed: Feb. 18, 1992

[51] Int. Cl.⁵ .............................................. H01L 23/02
[52] U.S. Cl. .................................. 174/52.4; 174/52.2; 257/690
[58] Field of Search .............. 174/52.2, 52.4; 29/841, 29/855, 856; 437/209, 211, 212, 213, 219; 257/787, 788, 789, 795, 690

[56] References Cited

U.S. PATENT DOCUMENTS

| 5,025,114 | 6/1991 | Braden | 174/52.4 |
| 5,120,678 | 6/1992 | Moore et al. | 437/183 |
| 5,149,590 | 9/1992 | Arthur et al. | 428/421 |

OTHER PUBLICATIONS

S. R. Engle et, "Surface Solder Package", IBM TDB, vol. 30, No. 3, Aug., 1987, pp. 1240–1241.

Primary Examiner—Leo P. Picard
Assistant Examiner—Bot L. Ledynh
Attorney, Agent, or Firm—Bernard Tiegerman

[57] ABSTRACT

A ceramic chip carrier is disclosed which includes a ceramic substrate having a circuitized surface, at least one semiconductor chip mounted on the circuitized surface, and a lead frame or edge clip which is mechanically and electrically connected to contact pads on the circuitized surface. Each mechanical/electrical connection between the lead frame or edge clip and the contact pads includes a conventional solder connection. In addition, each such solder connection is at least partially encapsulated in a material, including an epoxy resin, which is chosen in relation to the solder connection to enable the solder connection to withstand a standard thermal fatigue test.

9 Claims, 1 Drawing Sheet

CERAMIC CHIP CARRIER WITH LEAD FRAME OR EDGE CLIP

BACKGROUND OF THE INVENTION

1. Field of the Invention

The invention pertains generally to ceramic chip carriers and, more particularly, to ceramic chip carriers which include lead frames or edge clips.

2. Description of the Related Art

One type of semiconductor chip package includes one or more semiconductor chips mounted on a circuitized surface of a ceramic, e.g., alumina, substrate. Typically, such a semiconductor chip package, conventionally termed a ceramic chip carrier, is intended for mounting on a printed circuit card or printed circuit board. If surface mounting is to be used, then, conventionally, a ceramic chip carrier will include a lead frame which is mechanically and electrically connected to electrical contact pads formed around the periphery of the chip-bearing, circuitized surface of the ceramic substrate.

Ceramic chip carriers of the type referred to above include both single-layer and multi-layer ceramic substrates. In the former case, the chip carrier is fabricated by initially circuitizing an upper surface of the single ceramic layer using conventional thick film metal screening techniques. The metal employed is, for example, an alloy of silver (Ag) and palladium (Pd), which has a melting temperature of 1145° C. and an electrical resistivity of $20 \times 10^{-8}$ ohm-meters ($\Omega$-m). The resulting circuit lines typically have thicknesses and widths of, for example, 0.5 mils and 3 mils, respectively. After circuitization, the resulting ceramic layer is fired in air at a temperature of, for example, 850°-950° C., which is readily withstood by the Ag-Pd alloy. A semiconductor chip or chips is then mounted on the circuitized surface using conventional wire bonding techniques.

In the fabrication of a multi-layer ceramic substrate, each ceramic layer is usually circuitized using conventional thick film screening techniques, and these circuitized ceramic layers are then cured and laminated together at firing temperatures of, for example, 1900° C. To withstand these high temperatures, the circuitry on each of the circuitized layers typically consists of a refractory metal such as molybdenum (Mo) or tungsten (W), which have melting temperatures equal to or greater than 2625° C. and corresponding electrical resistivities equal to or greater than $5.2 \times 10^{-8}$ $\Omega$-m. As before, a chip or chips is conventionally mounted on the multi-layer ceramic substrate using conventional wire bonding techniques.

Regardless of whether the ceramic chip carrier includes a single-layer substrate or a multi-layer substrate, a lead frame has conventionally been mechanically and electrically connected to contact pads on such a ceramic chip carrier using conventional brazing techniques. The braze materials employed have included, for example, alloys of indium (In)-copper (Cu)-silver (Ag) and Cu-Ag, and the brazing temperatures have been as high as 750° C.

Significantly, the brazed joints between the lead frames and ceramic substrates of the ceramic chip carriers, described above, exhibit what is considered to be acceptable thermal fatigue resistance. That is, these joints readily withstand a standard thermal fatigue test during which they are subjected to sinusoidal temperature cycling between 0° C. and 100° C., at a frequency of three cycles per hour, for at least 2000 cycles without any significant increase in electrical resistance, i.e., any increase in electrical resistance, if it occurs, is less than 200 milliohms.

Currently, there is a need to reduce the width of the circuit lines on the circuitized surfaces of ceramic chip carriers to a value equal to or less than about 1 mil, while simultaneously reducing the thickness of the circuit lines and contact pads to a value equal to or less than about 0.3 mils. This is readily accomplished by a conventional thin film/subtractive etch process in which a metal layer is blanket deposited onto a ceramic substrate by conventional sputtering or evaporation techniques and then patterned via chemical etching to define circuitry on the ceramic surface. To avoid increasing the electrical resistances of the circuit lines, etchable metals having electrical resistivities equal to or less than about $6 \times 10^{-8}$ $\Omega$-m, such as copper (which has an electrical resistivity of $1.7 \times 10^{-8}$ $\Omega$-m), are employed.

There is now also a need to achieve a relatively high density of chip connections on ceramic substrates, which is not achievable using the conventional wire bonding technique. However, this is now readily accomplished using the so-called flip chip technique in which one or more chips are mounted face-down on solderable metal pads on a ceramic substrate, using solder balls. In this regard, a patterned layer of chromium on the copper circuitry is needed to serve as a solder dam, i.e., to control the solder volume of the solder ball connections.

Attempts to braze lead frames to ceramic chip carriers employing copper circuitry in combination with chromium solder dams, at the brazing temperatures associated with braze materials such as In-Cu-Ag and Cu-Ag alloys, have resulted in the chromium solder dams diffusing into the copper circuitry, making flip chip joining impossible. Consequently, brazing lead frames to such ceramic chip carriers, using these braze materials, is inappropriate.

Thus, those engaged in developing ceramic chip carriers have sought, thus far without success, a ceramic chip carrier which includes:

(1) thin film circuitry of, for example, copper in combination with a solder dam of, for example, chromium on a ceramic substrate, (2) one or more semiconductor chips mounted in a flip-chip configuration on the circuitized ceramic substrate using solder balls, (3) a lead frame connected to contact pads on the circuitized surface of the ceramic substrate, in which the mechanical/electrical connections are formed at temperatures below the temperature at which the solder dam diffuses into the circuitry, and (4) mechanical/electrical connections which are capable of withstanding the standard thermal fatigue test.

SUMMARY OF THE INVENTION

The invention involves a new ceramic chip carrier having circuitry and contact pads of, for example, copper, in combination with a solder dam of, for example, chromium. In addition, this ceramic chip carrier includes an electrically conductive lead frame or edge clip, mechanically and electrically connected to the contact pads, which permits surface mounting onto a printed circuit card or printed circuit board.

By contrast with previous ceramic chip carriers, each mechanical/electrical connection between the lead frame or edge clip and the corresponding contact pad includes a conventional solder connection, which is formed at a temperature below the temperature at which the solder dam diffuses into the copper circuitry. However, such a conventional solder connection, per se, is incapable of passing the standard thermal fatigue test, i.e., such a solder connection will exhibit an increase in electrical resistance equal to or greater than 200 milliohms after being subjected to sinusoidal thermal cycling between 0° C. and 100°, at a frequency of three cycles per hour, for at least 2,000 cycles.

Significantly, the invention also involves the finding that encapsulating a conventional solder connection with an epoxy resin at least partially filled with an appropriate type and amount of filler material serves to achieve a combination solder/epoxy resin connection which readily passes the standard thermal fatigue test. Among its most important features, the at least partially filled epoxy resin should have a coefficient of thermal expansion (CTE) which is within ±30% of the CTE of the solder connection. Provided this requirement is met, it has been found that stresses applied to the solder connection, such as those applied during the standard thermal fatigue test, are shared by the at least partially filled epoxy resin, and the combination solder/epoxy resin connection readily passes the standard fatigue test. On the other hand, if the CTE of the at least partially filled epoxy resin does not meet the above requirement, then it has also been found that there is little or no stress sharing, and such a solder/epoxy resin connection will fail the standard fatigue test.

BRIEF DESCRIPTION OF THE DRAWING

The invention is described with reference to the single accompanying drawing, which is a cross-sectional view of a preferred embodiment of the inventive ceramic chip carrier.

DETAILED DESCRIPTION OF THE PREFERRED EMBODIMENT

Figure 1:
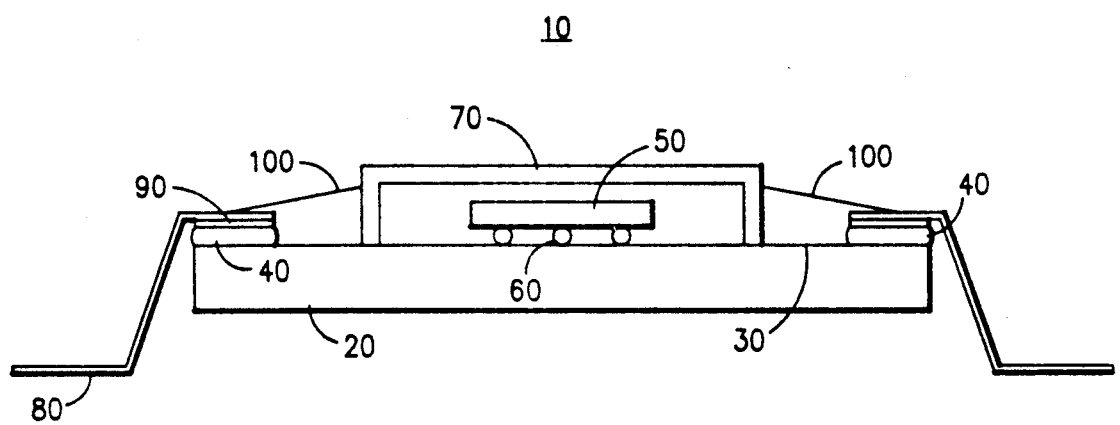

The invention involves a ceramic chip carrier which includes, for example, a single-layer ceramic substrate having an upper circuitized surface where the circuitry and contact pads are of, for example, copper, in combination with a solder dam of, for example, chromium. In addition, the inventive ceramic chip carrier includes a metallic lead frame or edge clip, mechanically and electrically connected to one or more contact pads on the circuitized surface of the chip carrier, which permits the ceramic chip carrier to be surface mounted onto a printed circuit card or printed circuit board. Significantly, the mechanical/electrical connections between the lead frame or edge clip and the one or more contact pads are achieved at a temperature below the temperature at which the solder dam diffuses into the copper circuitry. Moreover, these mechanical/electrical connections readily pass the standard thermal fatigue test.

As depicted in the single accompanying drawing, a preferred embodiment of the inventive ceramic chip carrier 10 includes a single-layer ceramic, e.g., alumina, substrate 20. This substrate has at least one surface 30 bearing circuitry, including circuit lines (not shown) and one or more electrical contact pads 40 positioned adjacent the outer periphery of the surface 30. This circuitry is formed using, for example, the conventional thin film/substractive etch process yielding circuit lines having widths which are preferably equal to or less than about 1 mil and thicknesses which are preferably equal to or less than about 0.3 mils. In addition, the circuit lines and contact pads 40 are of an etchable metal having an electrical resistivity equal to or less than about $1.7 \times 10^{-8}$ $\Omega$-m, such as copper (Cu). Although not depicted in the drawing, a patterned layer of chromium, having a thickness of, for example, 800 Å (Angstroms), is preferably provided between the circuitry and the ceramic substrate 20 to increase the adhesion of the former to the latter. In addition, a patterned layer of, for example, chromium, having a thickness of, for example, 1100 Å, is provided directly on top of the circuitry to serve as a solder dam.

At least one semiconductor chip 50 is preferably mounted in a flip-chip configuration on the circuitized surface 30 of the ceramic substrate 20 using, for example, solder balls 60. A ceramic, e.g. alumina, cap 70 is, for example, epoxied to the surface 30, over the semiconductor chip 50, so as to protect the chip 50 from mechanical damage and from the environment. While the cap 70 also serves to cover and protect a portion of the circuitry on the surface 30, a significant portion of the circuitry is not covered, and therefore not protected, by the cap 70.

The inventive ceramic chip carrier 10 also includes a metallic lead frame or edge clip 80 of, for example, copper, which is mechanically and electrically connected to the contact pads 40. Each of the mechanical/electrical connections between the lead frame or edge clip 80 and the contact pads 40 includes a region of solder 90, having a composition which includes, for example, 10% (by weight) tin (Sn) and 90% (by weight) lead (Pb). Such a solder connection is readily formed by depositing a corresponding region of solid solder onto a contact pad 40, placing the lead frame or edge clip 80 on the region of solder, and then melting and reflowing the solder at a temperature of, for example, 365° C., which is below the temperature at which the chromium solder dam diffuses into the copper circuitry. As noted above, this solder connection, per se, is incapable of passing the standard thermal fatigue test.

Significantly, in accordance with the invention, each solder connection between a contact pad 40 and the lead frame or edge clip 80 is at least partially, and preferably totally, encapsulated in a region of material 100 which is chosen in relation to the solder connection so that the solder connection is capable of passing the standard thermal fatigue test. In addition, the material 100 is preferably also chosen so as to be useful in encapsulating the exposed circuitry on the surface 30, as depicted in the drawing, in order to protect the circuitry from the environment.

With regard to the choice of the material 100, a main ingredient is invariably an epoxy resin. In this regard, a wide variety of epoxy resins, including cyclohexyldiepoxide resin, have been found to be useful within the context of the invention. However, all of these epoxy resins, per se, have also been found to have coefficients of thermal expansion (CTEs) which are more than 30% greater than the CTE of the solder connection. For example, a 10% tin-90% lead solder connection has a CTE of 30 ppm/° C., while the CTE of unfilled typical epoxy resins range from 50-300 ppm/° C. By virtue of such a CTE difference, it has been found that the use of any such epoxy resin, per se, in combination with a solder connection results in a mechanical/electrical connection which fails the standard thermal fatigue test.

In further accordance with the invention, it has been determined that whatever epoxy resin is employed, in general it must be modified by incorporating an appropriate filler material into the epoxy resin, having a CTE lower than that of the epoxy resin, per se, to achieve an at least partially filled epoxy resin having a relatively low CTE. Moreover, it has been found that increasing the amount of such filler material decreases the CTE of the at least partially filled epoxy resin. Thus, by adding an appropriate amount of filler material, an at least partially filled epoxy resin is readily achieved which exhibits a CTE which is within 30% of the CTE of the corresponding solder connection.

To avoid short-circuiting the electrical connection between a contact pad 40 and the lead frame or edge clip 80, the filler material should be electrically insulating. Thus, one useful filler material is, for example, silica.

In choosing an epoxy resin (at least partially filled with an appropriate filler material), it is generally desirable that the (at least partially filled) uncured epoxy resin has a viscosity in the range of 195–265 Pascal-seconds (Pa-S) at 25° C. and 2.5 rpm. As a result, such an (at least partially filled) epoxy resin is readily dispensed using a syringe, and readily flows over a surface which includes, for example, a lead frame or edge clip soldered to contact pads.

If, for example, the solder connection, per se, has a composition which includes 10% tin and 90% lead, and if the corresponding epoxy resin has a composition which includes, for example, cyclohexyldiepoxide resin, then it has been found that the amount of silica filler material incorporated into the epoxy resin should range from about 60% (by weight) to about 70% (by weight). Amounts of filler material less than about 60% (by weight) are undesirable because the CTE will be too high and the flow characteristics undesirable. In addition, amounts of filler material greater than about 70% (by weight) are undesirable because viscosity becomes too high and material cannot readily be dispensed.

Preferably, the (at least partially filled) epoxy resins useful in connection with the present invention are chosen to exhibit glass transition temperatures, $T_g$, which are greater than the operating temperature of the ceramic chip carrier 10. Otherwise, material fracture will occur.

A preferred embodiment of an (at least partially filled) cyclohexyldiepoxide resin having the above desirable characteristics is one sold under the tradename Hysol FP0045 by the Dexter Corporation of California, USA. As sold, this (at least partially filled) epoxy resin includes between 63% (by weight) and 66.5% (by weight) silica filler material, with the corresponding CTEs of the at least partially filled epoxy resin ranging from about 25–35 ppm/° C. The Hysol FP0045 also exhibits a viscosity of 195–265 Pa-S at 25° C., and, when dispensed through a syringe, readily flows over surfaces of interest.

After the Hysol FP0045 is deposited via, for example, a syringe onto portions of the lead frame or edge clip 80, solder connections 90, contact pads 40 and exposed circuitry on the surface 30 of the ceramic chip carrier 10, this resin is readily partially cured, by heating the ceramic chip carrier on a hot plate at 120° C. for approximately one-half hour. The epoxy resin is then readily fully cured by heating the ceramic chip carrier in a hot air oven, at 150° C., for at least two hours, and preferably for four hours. The resulting solder/(at least partially filled) epoxy resin connections then readily pass the standard fatigue test.

While the invention has been particularly shown and described with reference to a preferred embodiment thereof, it will be understood by those skilled in the art that various changes in form and details may be made therein without departing from the spirit and scope of the invention.

We claim:

1. A semiconductor chip package, comprising:
   a ceramic substrate, including a circuitized surface, said surface supporting at least one electrical contact pad;
   at least one semiconductor chip mounted on said circuitized surface of said ceramic substrate; and
   a lead frame or edge clip which is mechanically and electrically connected to said at least one contact pad, Characterized In That
   the mechanical and electrical connection between the lead frame or edge clip and said at least one contact pad includes a region of solder at least partially encapsulated in a region of material including an epoxy resin, said material region being chosen in relation to said solder region so that said solder region exhibits an increase in electrical resistance less than 200 milliohms after said solder/material connection is subjected to sinusoidal thermal cycling from 0° C. to 100° C., at a frequency of 3 cycles per hour, for 2000 cycles.

2. The semiconductor chip package of claim 1, wherein said solder region is characterized by a first coefficient of thermal expansion, $CTE_1$, and said material region is characterized by a second coefficient of thermal expansion, $CTE_2$, and wherein $$CTE_1 30\% CTE_1 \leq CTE_2 CTE_1 + 30\% CTE_1.$$

3. The semiconductor chip package of claim 1, wherein said epoxy resin is at least partially filled with a filler material, which filler material, per se, has a coefficient of thermal expansion which is less than a coefficient of thermal expansion of said epoxy resin, per se.

4. The semiconductor chip package of claim 1, wherein said epoxy resin includes cyclohexyldiepoxide resin.

5. The semiconductor chip package of claim 3, wherein said filler material is electrically insulating.

6. The semiconductor chip package of claim 3, wherein said filler material includes silica.

7. The semiconductor chip package of claim 1, further comprising a ceramic cap on said circuitized surface, overlying said at least one semiconductor chip.

8. The semiconductor chip package of claim 1, wherein said ceramic substrate includes alumina.

9. The semiconductor chip package of claim 1, wherein said at least one electrical contact pad includes copper.

* * * * *